(12) United States Patent
Appelt et al.

(10) Patent No.: US 8,104,171 B2
(45) Date of Patent: Jan. 31, 2012

(54) METHOD OF FABRICATING MULTI-LAYERED SUBSTRATE

(75) Inventors: Bernd Karl Appelt, Gulf Breeze, FL (US); Yuan-Chang Su, Taoyuan County (TW); Ming-Chiang Lee, Kaohsiung (TW); You-Lung Yen, Taoyuan County (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 769 days.

(21) Appl. No.: 12/199,149

(22) Filed: Aug. 27, 2008

(65) Prior Publication Data

US 2010/0055392 A1 Mar. 4, 2010

(51) Int. Cl.
*H01K 3/10* (2006.01)
*B29C 65/00* (2006.01)

(52) U.S. Cl. ............. 29/852; 29/830; 29/831; 29/832; 29/846; 29/847; 156/182

(58) Field of Classification Search .............. 29/852, 29/846, 847, 830, 831, 832, 838; 257/773, 257/678, 777, 785, 760; 174/155, 258, 260–266; 156/182, 344; 428/137
See application file for complete search history.

(56) References Cited

U.S. PATENT DOCUMENTS

| | | | | |
|---|---|---|---|---|
| 3,675,318 A | * | 7/1972 | Merkenschlager | 29/852 |
| 5,509,200 A | * | 4/1996 | Frankeny et al. | 29/852 |
| 6,580,036 B2 | | 6/2003 | Kim et al. | |
| 6,768,260 B2 | * | 7/2004 | Fukunaga et al. | 313/506 |
| 7,346,982 B2 | | 3/2008 | Kim et al. | |
| 2004/0256731 A1 | * | 12/2004 | Mao et al. | 257/773 |

FOREIGN PATENT DOCUMENTS

| | | |
|---|---|---|
| CN | 1568129 | 1/2005 |
| CN | 1980542 | 6/2007 |

OTHER PUBLICATIONS

Chinese First Examination Report of China Application No. 200910171341.4, dated Jul. 14, 2010.

\* cited by examiner

*Primary Examiner* — Derris Banks
*Assistant Examiner* — Tai Nguyen
(74) *Attorney, Agent, or Firm* — J.C. Patents

(57) ABSTRACT

The present invention directs to fabrication methods of single-sided or double-sided multi-layered substrate by providing a lamination structure having at least a core structure and first and second laminate structures stacked over both surfaces of the core structure. The core structure functions as the temporary carrier for carrying the first and second laminate structures through the double-sided processing procedures. By way of the fabrication methods, the production yield can be greatly improved without increasing the production costs.

13 Claims, 13 Drawing Sheets

METHOD OF FABRICATING MULTI-LAYERED SUBSTRATE

BACKGROUND OF THE INVENTION

1. Field of the Invention

The present invention relates to a chip package structure and a fabricating method thereof. More particularly, the present invention relates to a fabrication method of a multi-layered substrate and the multi-layered substrate thereof.

2. Description of Related Art

The board on chip (BOC) packaging concept, which uses a board substrate mounted above the silicon chip(s) as the lead-on-chip (LOC) technology, has been developed for high frequency applications. The BOC substrates or certain window ball grid array (BGA) substrates are essentially single-sided substrates i.e. circuit patterns and fiducials are only located on one side of the substrates. At present, rather wasteful approaches are employed to fabricate these single-sided substrates, as the dummy side of the substrates went through the similar processing steps and then removed. Therefore, not only the raw materials and processing chemicals are wasted but also the efforts spent on the dummy side become futile.

It is desirable to develop suitable manufacturing procedure for such substrate using the present manufacturing line.

SUMMARY OF THE INVENTION

Accordingly, the present invention is directed to a fabrication method of a multi-layered substrate, which is capable of doubling the productivity or yield and is compatible with the present manufacturing processes.

The present invention is also directed to a fabrication method of fabricating a multi-layered substrate structure, which can provide single-sided or double-sided substrate structure.

As embodied and broadly described herein, the present invention directs to a method of fabricating a multi-layered substrate by providing a double-sided lamination structure having at least a core structure and first and second laminate structures stacked over both surfaces of the core structure. The core structure functions as the temporary carrier for carrying the first and second laminate structures through the double-sided processing procedures.

The laminate structure can be either a single-clad laminate having a metal layer at one side or a double-clad laminate having two metal layers respectively at both sides.

As embodied and broadly described herein, when the first and second laminate structures are single-clad laminates, after the two outermost metal layers of the double-sided lamination structure are patterned and protected with mask layers, single-sided substrates are obtained by separating the first and second laminate structures from the core structure.

As embodied and broadly described herein, when the first and second laminate structures are double-clad laminates, after the two outermost metal layers of the double-sided lamination structure are patterned and protected with mask layers, the first and second laminate structures are separated from the core structure, turned inversely and re-laminated to a carrier for further processing. The metal layer at the other side of the first/second laminate structure can be either removed or further patterned to provide single-sided substrates or double-sided substrates.

In an embodiment of the present invention, the fabrication method may further comprise forming a plurality of plated-through holes in the double-sided lamination structure by drilling and plating.

In an embodiment of the present invention, the fabrication method may further comprise performing a surface plating process to form a Ni/Au layer located on the metal layer that is not covered by the mask layer.

The present invention further provides a multi-layered substrate structure. The substrate structure includes a base having a top surface, a bottom surface, and at least a through-hole passing through the base, patterned first and second metal layers formed respectively on the bottom surface and the top surface of the base, a first plating layer covering a sidewall of the through-hole and the bottom surface surrounding a bottom opening of the through hole, and a second plating layer covering the first plating layer and the top surface surrounding the top opening of the through hole.

In the present invention, the multi-layered substrate structure has the plated-through holes with double plating layers, which reinforces the plated-through holes for better electrical performances In order to make the aforementioned and other objects, features and advantages of the present invention comprehensible, embodiments accompanied with figures are described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
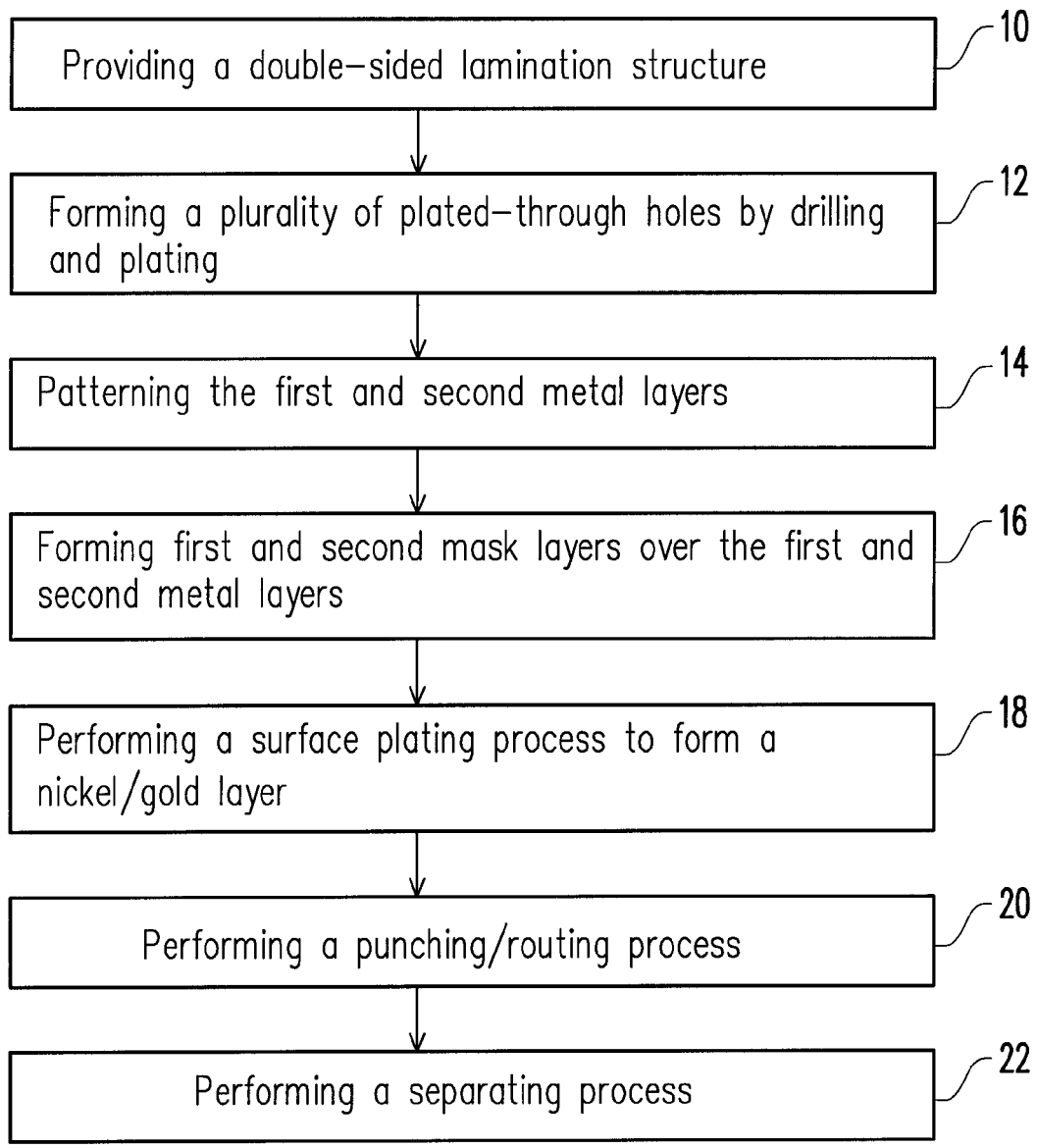
FIG. 1 is flow chart of process steps for fabricating a substrate according to an embodiment of the present invention.

The present invention is described below in detail with reference to the accompanying drawings, and the embodiments of the present invention are shown in the accompanying drawings. However, the present invention can also be implemented in a plurality of different forms, so it should not be interpreted as being limited in the following embodiments. Actually, the following embodiments are intended to demonstrate and illustrate the present invention in a more detailed and completed way, and to fully convey the scope of the present invention to those of ordinary skill in the art. In the accompanying drawings, in order to be specific, the size and relative size of each layer and each region may be exaggeratedly depicted.

It should be known that although "first", "second" and the like are used in the present invention to describe each element, region, layer, and/or part, such words are not intended to restrict the element, the region, the layer, and/or the part, but shall be considered to distinguish one element, region, layer, or part from another. Therefore, under the circumstance of without departing from the teaching of the present invention, the first element, region, layer, or part can also be called the second element, region, layer, or part.

In addition, "under", "on", and similar words for indicating the relative space position are used in the present invention to illustrate the relationship between a certain element or feature and another element or feature in the drawings. It should be known that, beside those relative space words for indicating the directions depicted in the drawings, if the element in the drawing is inverted, the element described as "under" another element or feature becomes "on" another element or feature.

FIG. 1 is flow chart of process steps for fabricating a substrate according to an embodiment of the present invention. FIGS. 2A-2G are cross-sectional views showing the substrate according to the fabricating process steps of an embodiment in the present invention.

Figure 2A:
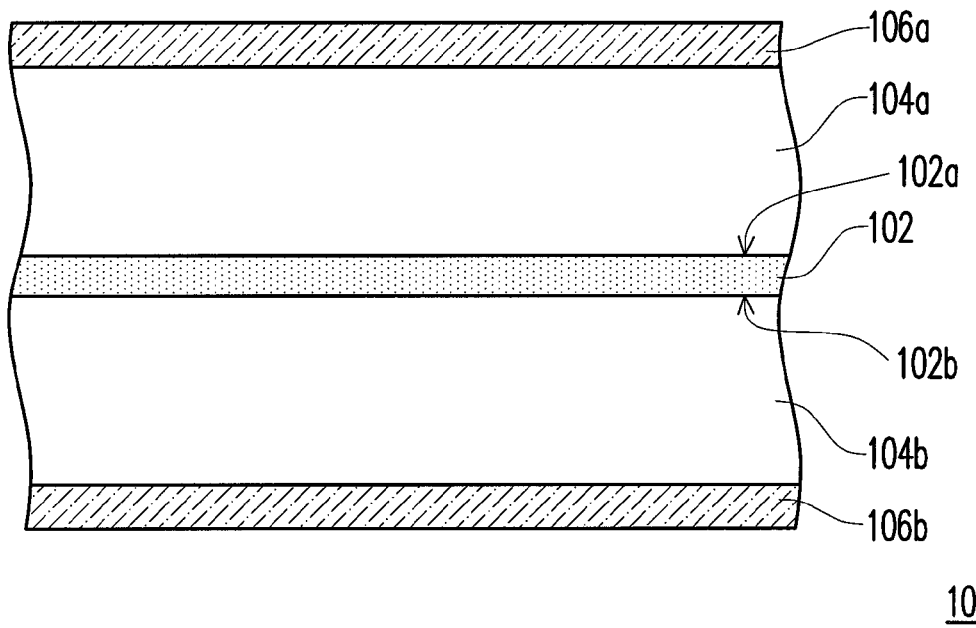
FIGS. 2A-2G are cross-sectional views showing the substrate according to the fabricating process steps of an embodiment in the present invention.

Firstly, in Step 10 & FIG. 2A, a double-sided lamination structure 100 is provided, which has a first metal layer 106a and a first passivation or dielectric layer 104a disposed on a top surface 102a of the core structure 102 and a second metal layer 106b and a second passivation layer 104b disposed on a bottom surface 102b of the core structure 102. The material of the first and the second metal layers 106a, 106b may be copper formed by electroplating or copper foil lamination, for example. The first and second passivation layers may be formed from the same or different resin materials, for example. The core structure 102 may be a release film or a peelable mask film, for example. The release film may be made of a Teflon-based material (such as Tedlar® film), and has very limited adhesion toward the passivation layer. If the release film is used, adhesive resin may be applied on the corners or the borders of the release film for enhancing the adhesion. If the peelable mask film is employed, the peelable mask film should achieve sufficient adhesion with the passivation layer during processing and remain peelable at the end of processing. For example, the peelable mask film can be applied on the borders (shaped as the picture frame) of the passivation layers.

Figure 2B:
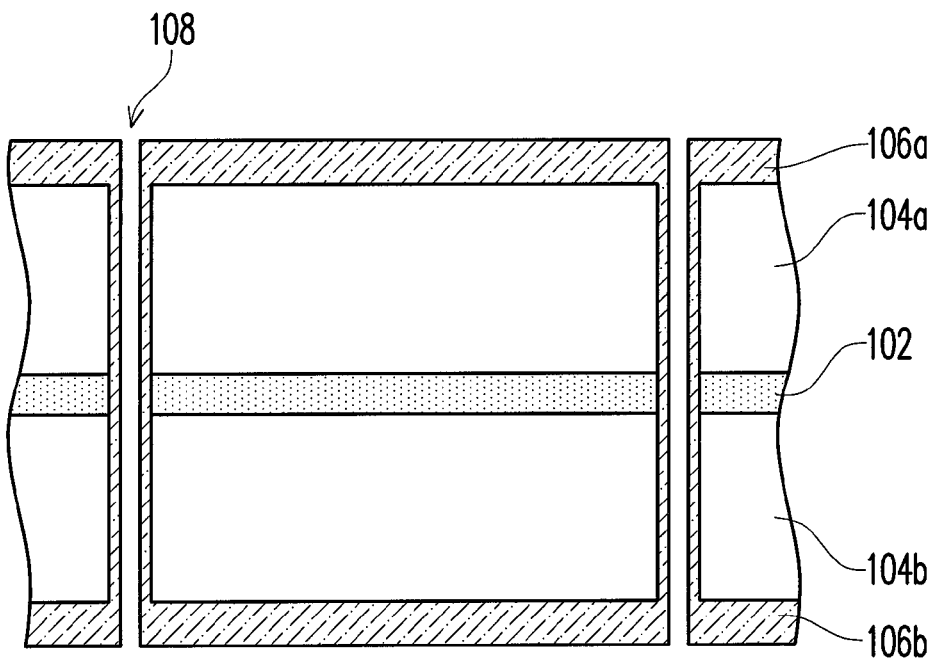

In Step 12 & FIG. 2B, a drilling process is performed by, for example, mechanical drilling or laser drilling to form through holes passing through the double-sided lamination structure 100. Then, an optional plating process is performed to electroplate the sidewalls of the through holes so as to form plated-through holes 108. The plating step may also be used to reinforce the Cu foil only.

Figure 2C:
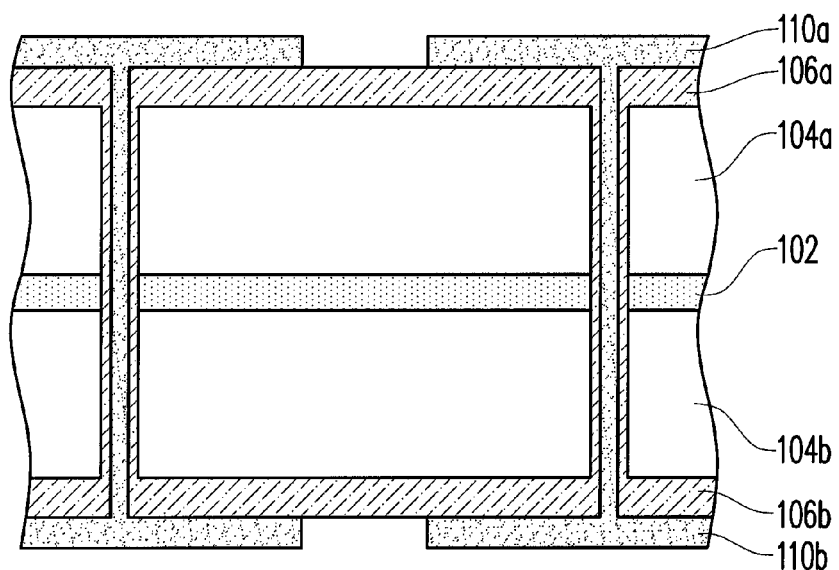

In Step 14 & FIG. 2C, after first and second patterned photoresist layers 110a, 110b are respectively formed on the first and second metal layers 106a, 106b, the first and second metal layers 106a, 106b are patterned, using the first and second patterned photoresist layers 110a, 110b as the etching masks.

Figure 2D:
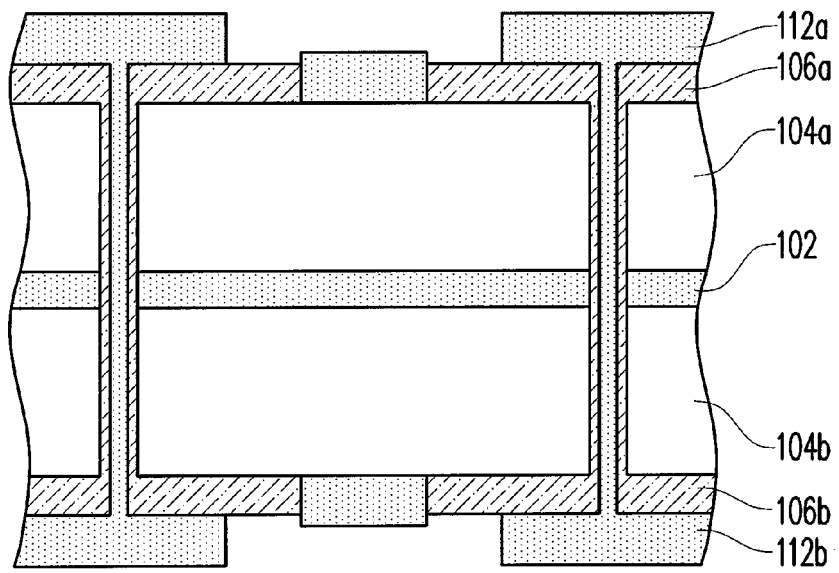

In Step 16 & FIG. 2D, after removing the remained first and second patterned photoresist layers 110a, 110b, first and second mask layers 112a, 112b are respectively formed on the first and second passivation layers 104a, 104b and partially covering the first and second metal layers 106a, 106b. The first and second mask layers may be solder mask layers, for example.

Figure 2E:
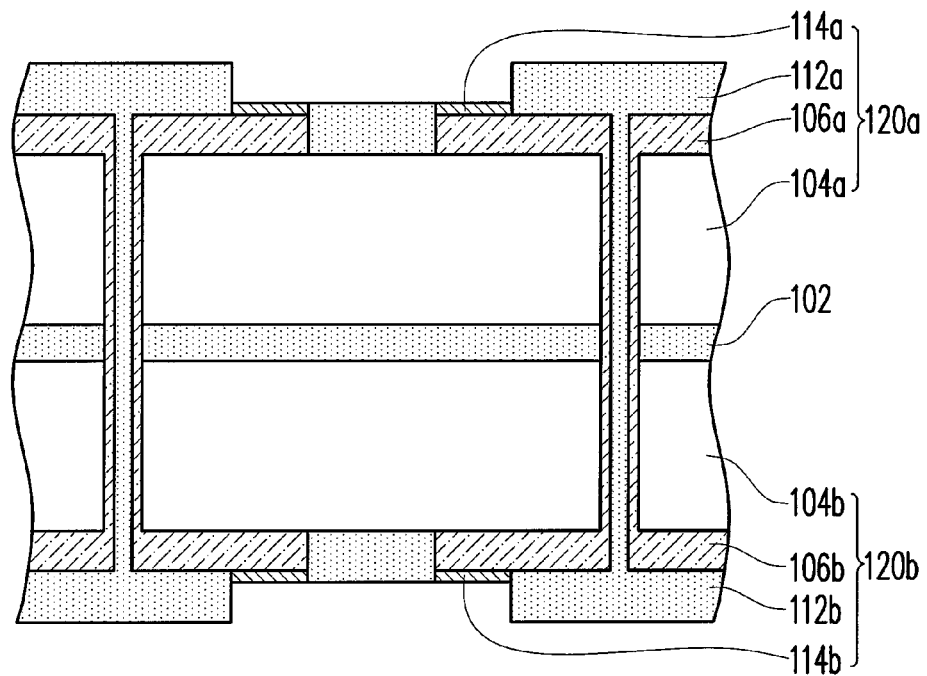

In Step 18 & FIG. 2E, a surface plating process is performed to form a nickel/gold layer 114a/b on the exposed surfaces of the first and second metal layers 106a, 106b respectively.

Figure 2F:
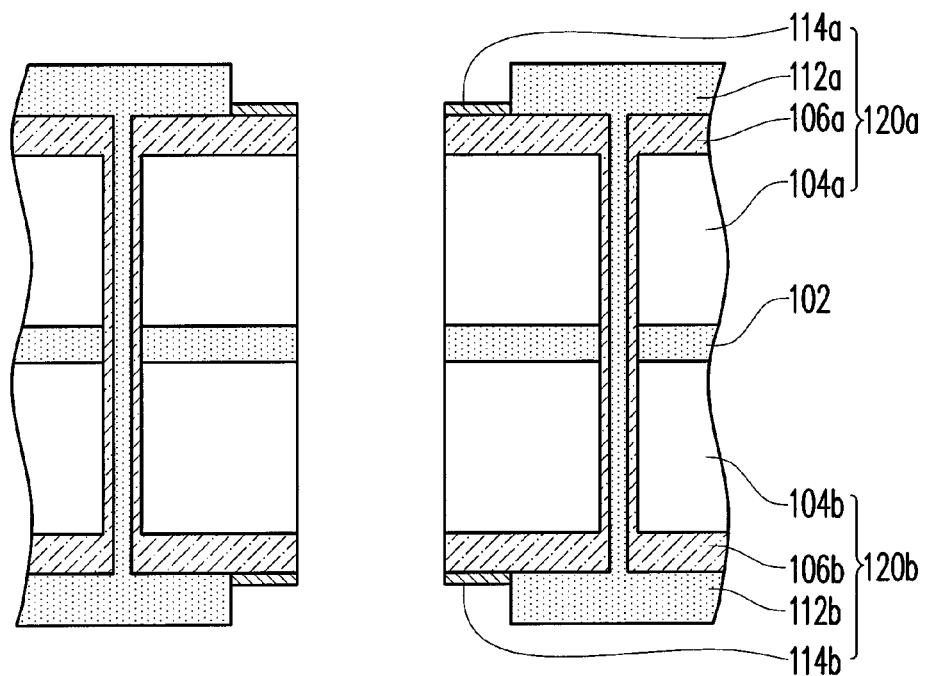

In Step 20 & FIG. 2F, a punching/routing process may be performed to cut bond channels into the substrates to form a BOC type substrate. In the same pass or in a separate punching/routing pass, the strips may be cut from the panel or the border frame of the double-sided lamination structure 100 may be cut off.

Figure 2G:
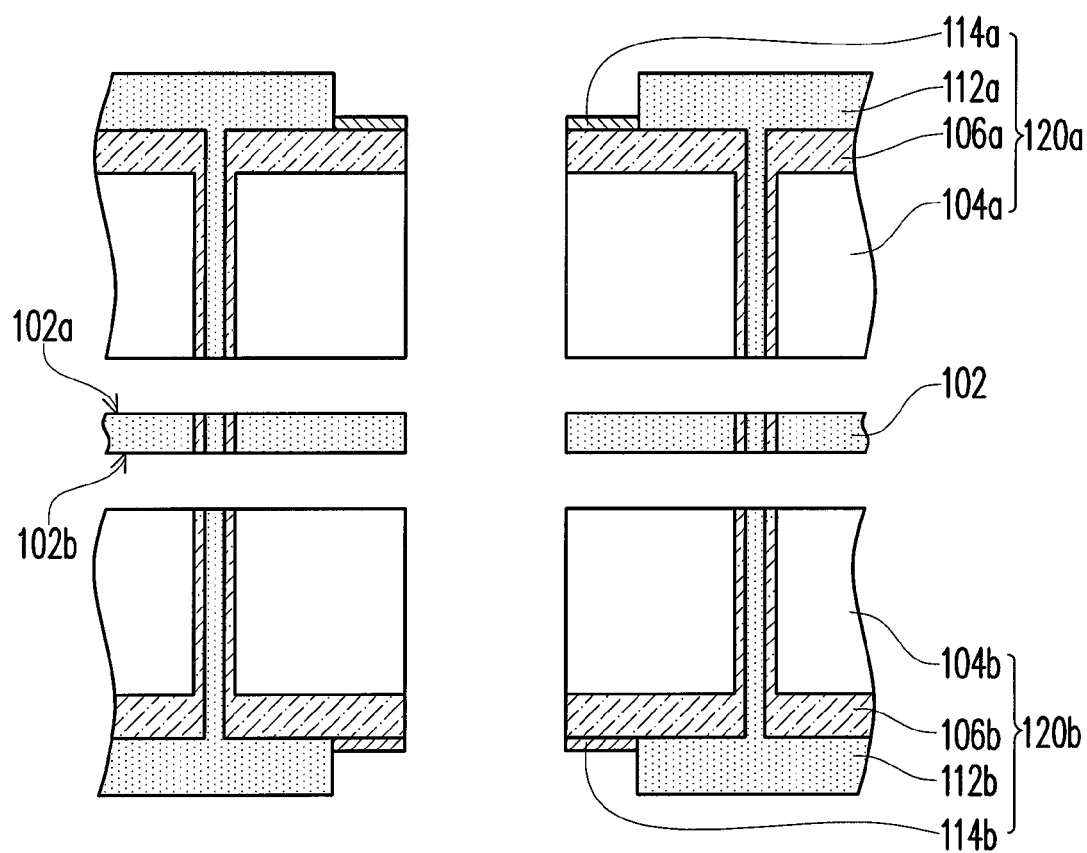

In Step 22 & FIG. 2G, a separating process is performed to the double-sided lamination structure 100, so that two single-sided substrate structures 120a, 120b are obtained. The first single-sided substrate structure 120a, including the first passivation layer 104a, the patterned first metal layer 106a, the first mask layer 112a and the first nickel/gold layer 114a, is detached from the top surface 102a and separated from the core structure 102. Similarly, the second single-sided substrate structure 120b, including the second passivation layer 104b, the patterned second metal layer 106b, the second mask layer 112b and the second nickel/gold layer 114b, is detached from the bottom surface 102b and separated from the core structure 102. If strips were punched/routed out of the panel, then the separating process forms individual strips. If only the border was cut off, then individual panels are formed which need to be cut into strips in a later process step.

According to the fabrication process of the present invention, metal layers and passivation layers can be stacked on both surfaces of the temporary carrier as the double-sided lamination structure, and both sides of the lamination structure can be processed and then separated to provide single-sided substrates. As the single-sided substrates are detached from the temporary carrier, the bottom surface or the blank backside of the single-sided substrates is protected by the temporary carrier and turns out to be a pretty smooth surface, having a roughness $R_z \leqq 5$ um, for example. That is, the bottom surface or the blank backside of the single-sided substrates is significantly smoother than the conventional backside where copper has been etched or polished.

Figure 3:
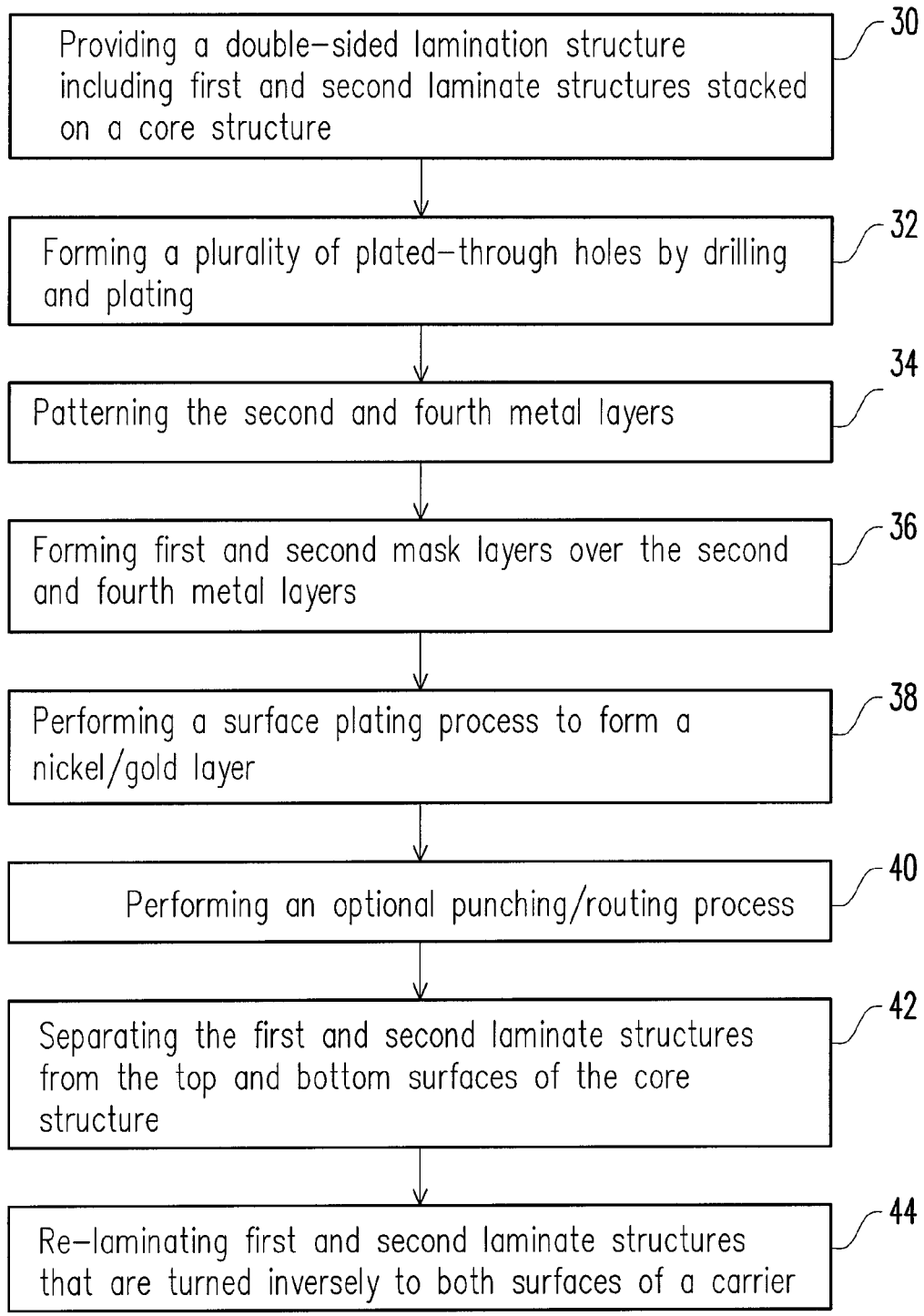
FIG. 3 is flow chart of process steps for fabricating a multi-layered substrate according to another embodiment of the present invention.

FIG. 3 is flow chart of process steps for fabricating a multi-layered substrate according to another embodiment of the present invention. FIGS. 4A-4G are cross-sectional views showing the multi-layered substrate according to the fabricating process steps of another embodiment in the present invention.

Figure 4A:
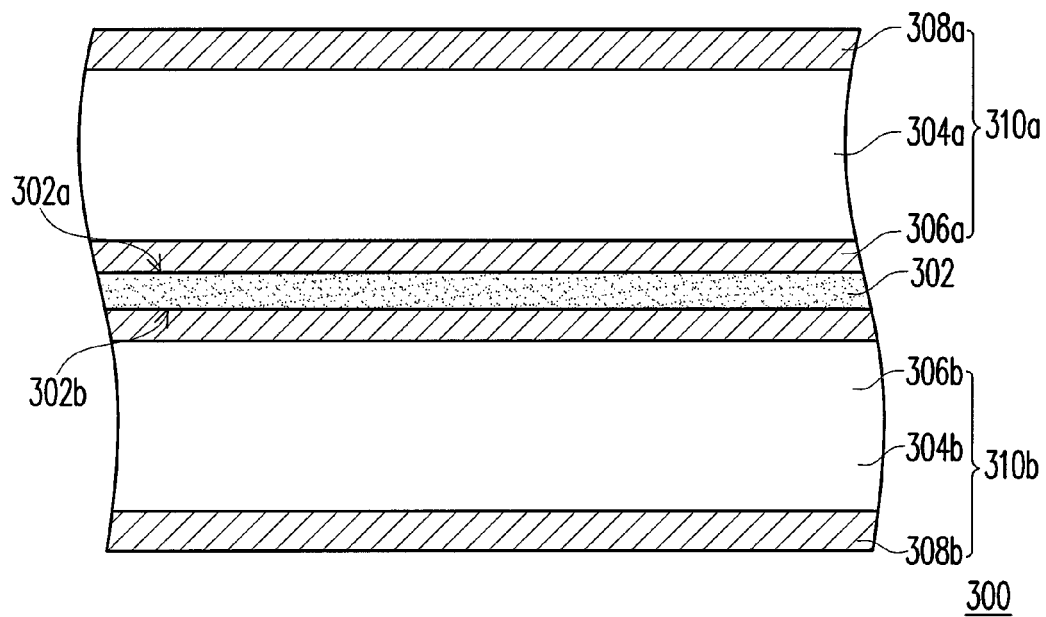
FIGS. 4A-4G are cross-sectional views showing the multi-layered substrate according to the fabricating process steps of another embodiment in the present invention.
Figure 4A:
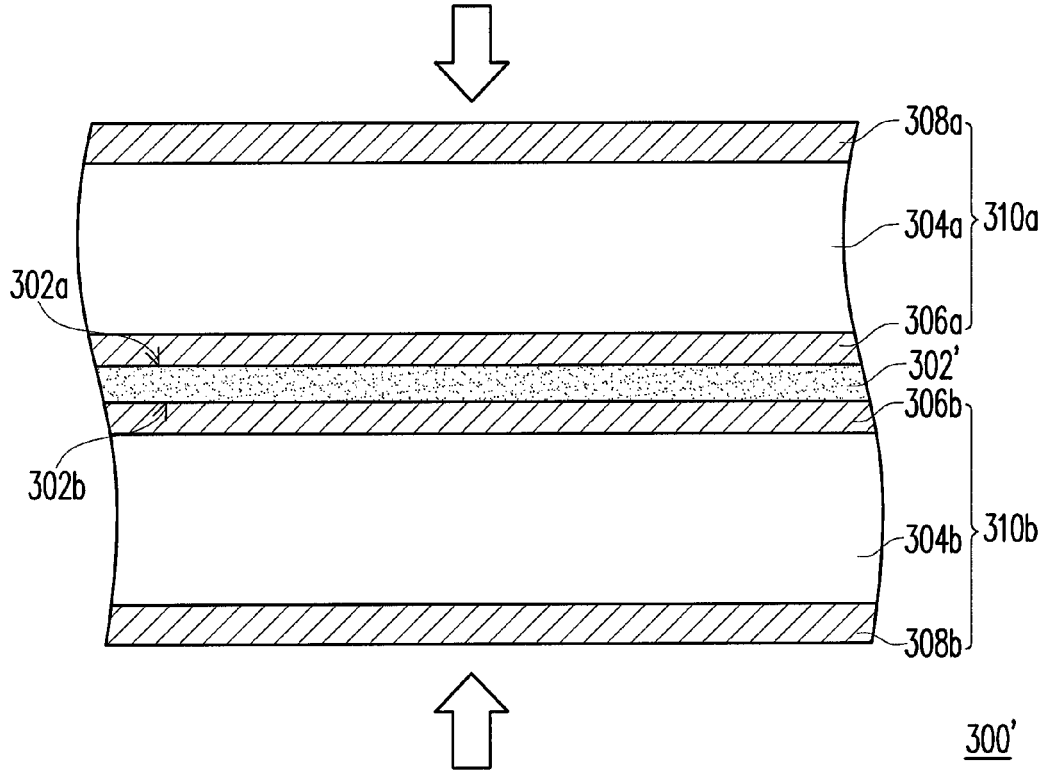

Firstly, in Step 30 & FIG. 4A, a double-sided lamination structure 300 is provided, which has a first laminate structure 310a disposed on a top surface 302a of the core structure 302 and a second laminate structure 310b disposed on a bottom surface 302b of the core 302 structure. The first laminate structure 310a includes a first metal layer 306a, a second metal layer 308a and a first passivation layer 304a sandwiched there-between, while the second laminate structure 310b includes a third metal layer 306b, a fourth metal layer 308b and a second passivation layer 304b sandwiched there-between. The first and second laminate structures 310a, 310b may be copper clad laminates (CCL), and the material of the metal layers may be copper formed by electroplating or copper foil lamination, for example. The first and second passivation layers 304a, 304b may be formed from the same or different resin materials, for example. The core structure 302 may be a release film or a peelable mask film, for example.

The double-sided lamination structure 300 can be formed by joining the core structure 302 with two laminate structures 310a, 310b in sequence or simultaneously, for example. The release film may be made of a Teflon-based material (such as Tedlar® film), and has very limited adhesion toward the passivation layer or the metal layer. If the release film is employed as the core structure 302, adhesive resin may be applied on the corners or the borders of the release film for enhancing the adhesion. If the peelabel mask film is employed as the core structure 302, it is preferred to choose the size or the shape of the peelable mask film for achieving sufficient adhesion and remaining peelable at the end of processing. For example, the peelable mask film can be applied on the borders (shaped as the picture frame) of one or both of the laminate structures 310a, 310b.

Alternatively, as shown in FIG. 4A', the core structure 302' of the lamination structure 300' is an aluminum layer and the lamination structure 300' can be formed by laminating and pressing the metal layers and the passivation layers to both surfaces of the aluminum layer sequentially or simultaneously, for example. Such lamination structure 300' can be obtained through direct lamination or be commercially available. For the commercially available lamination structure 300', adhesive resin is usually applied on the borders (shaped as the picture frame) of one or both of the laminate structures 310a, 310b.

Figure 4B:
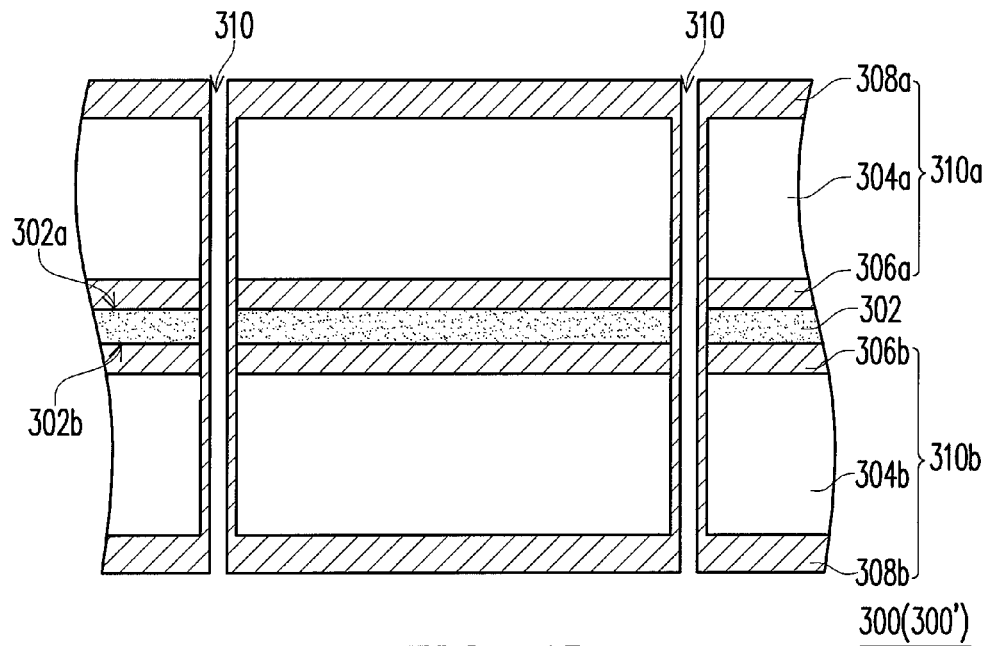

In Step 32 & FIG. 4B, a drilling process and a plating process are performed to form plated-through holes 310 passing through the double-sided lamination structure 300 (300').

Figure 4C:
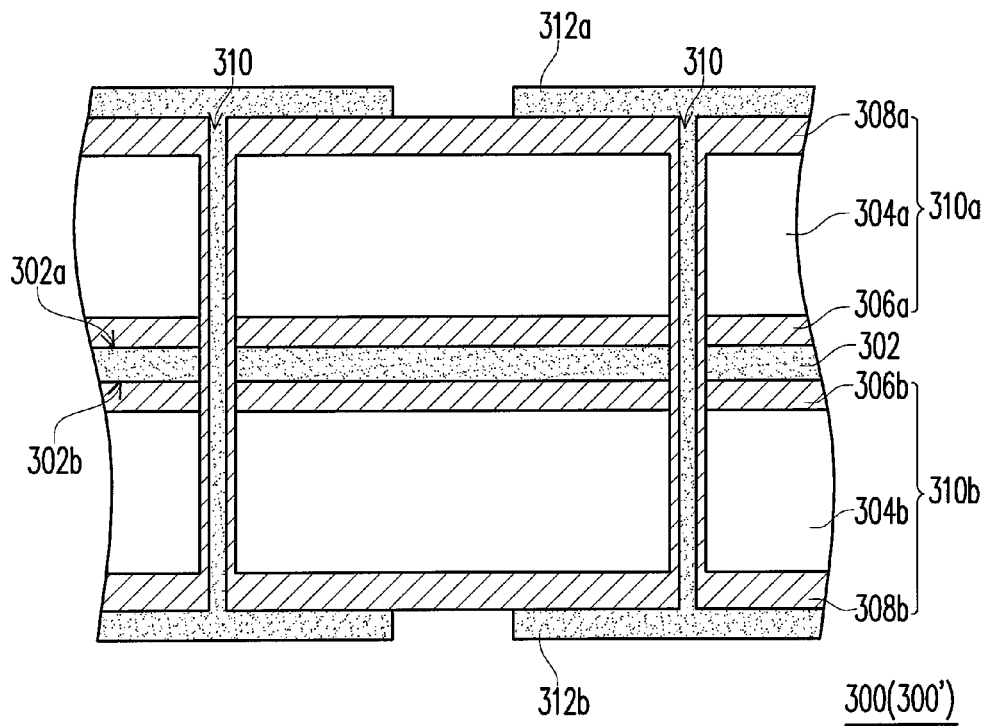

In Step 34 & FIG. 4C, after first and second patterned photoresist layers 312a, 312b are respectively formed on the second and fourth metal layers 308a, 308b, the second and fourth metal layers 308a, 308b are patterned, using the first and second patterned photoresist layers 312a, 312b as the etching masks.

Figure 4D:
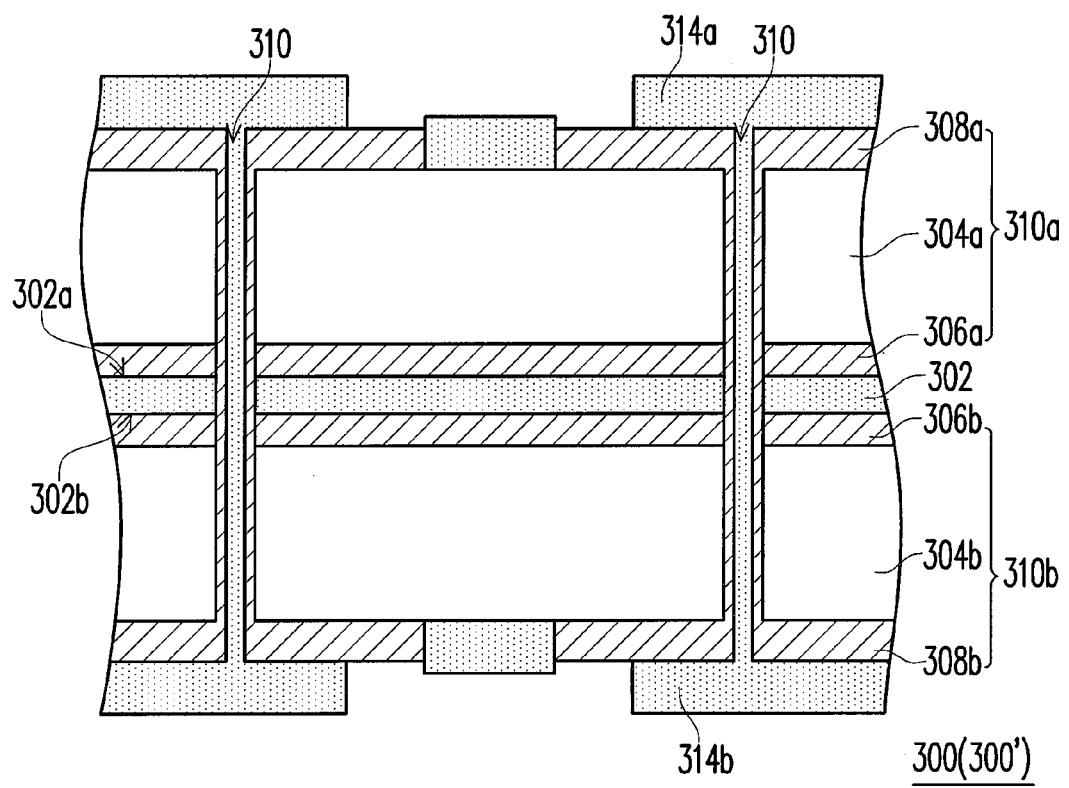

In Step 36 & FIG. 4D, after removing the remained first and second patterned photoresist layers 312a, 312b, first and second mask layers 314a, 314b are respectively formed on the first and second passivation layers 304a, 304b and partially covering the second and fourth metal layers 308a, 308b. The first and second mask layers may be solder mask layers, for example.

Figure 4E:
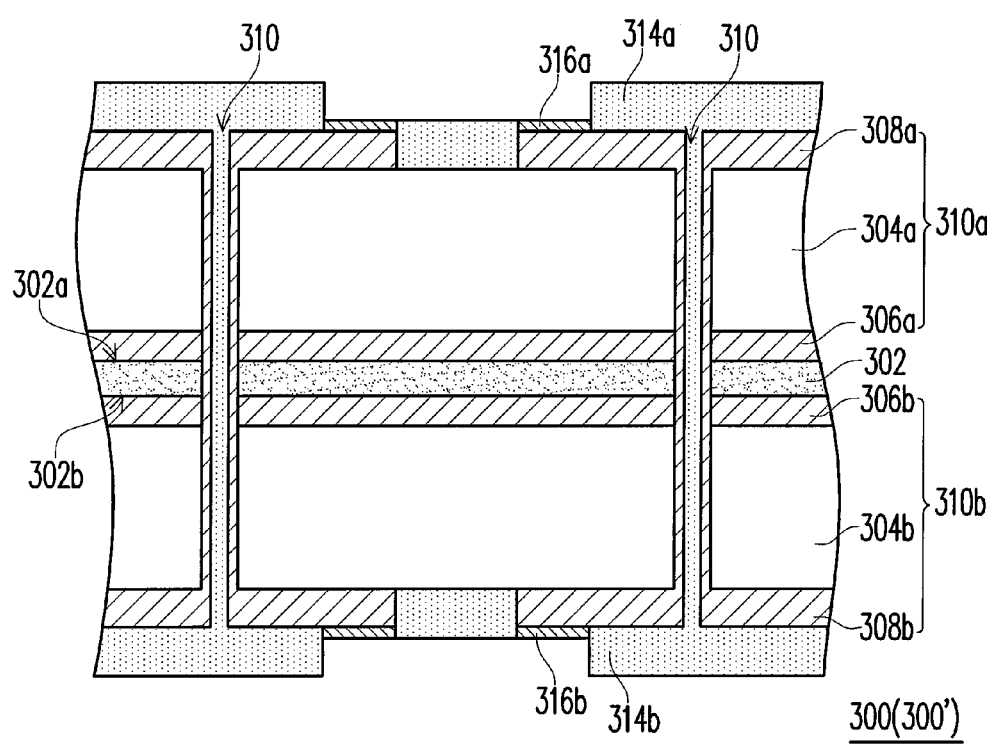

In Step 38 & FIG. 4E, a surface plating process is performed to form a nickel/gold layer 316a/b on the exposed surfaces of the second and fourth metal layers 308a, 308b respectively. Optionally, a protective layer (not shown) may be further formed over both surfaces of the double-sided lamination structure 300 (300').

In Step 40, a punching/routing process may be optionally performed to cut off the border frame of the double-sided lamination structure 300 (300').

Figure 4F:
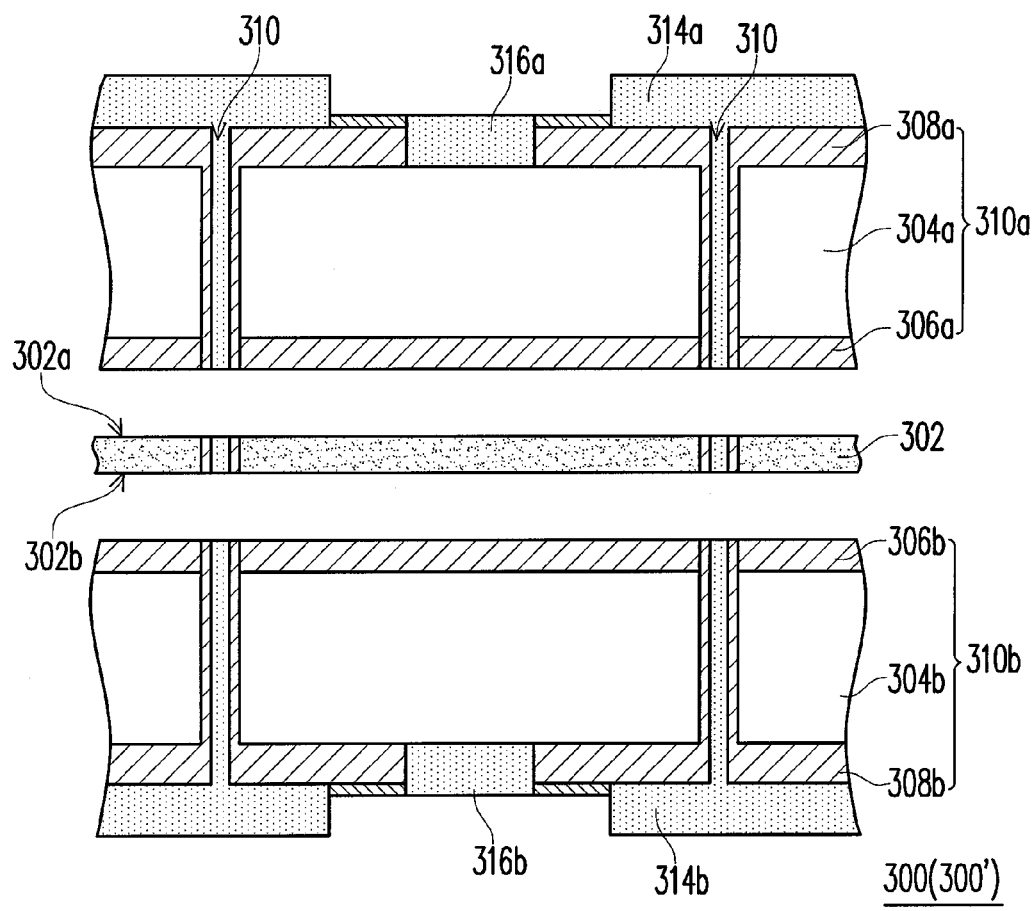

In Step 42 & FIG. 4F, the first and second laminate structures 310a, 310b are detached from the top and bottom surfaces 302a, 302b of the core structure 302 (302'). For the lamination structure 300, as the border frame is punched off, it is easy to separate the first and second laminate structures 310a, 310b from the core structure 302 by peeling with or without using an exatco knife blade, for example. For the commercially available lamination structure 300', as the border frame is removed along with the adhesive resin frame, the laminate structures 310a, 310b can be straightforwardly peeled apart. However, for the directly-laminated lamination structure 300', the separating process may require more force by using radius drums to peel the laminate structures 310a, 310b from the aluminum layer. Alternatively, for easier split, it is preferred to arrange small pieces of release films at corners before the direct lamination.

Figure 4G:
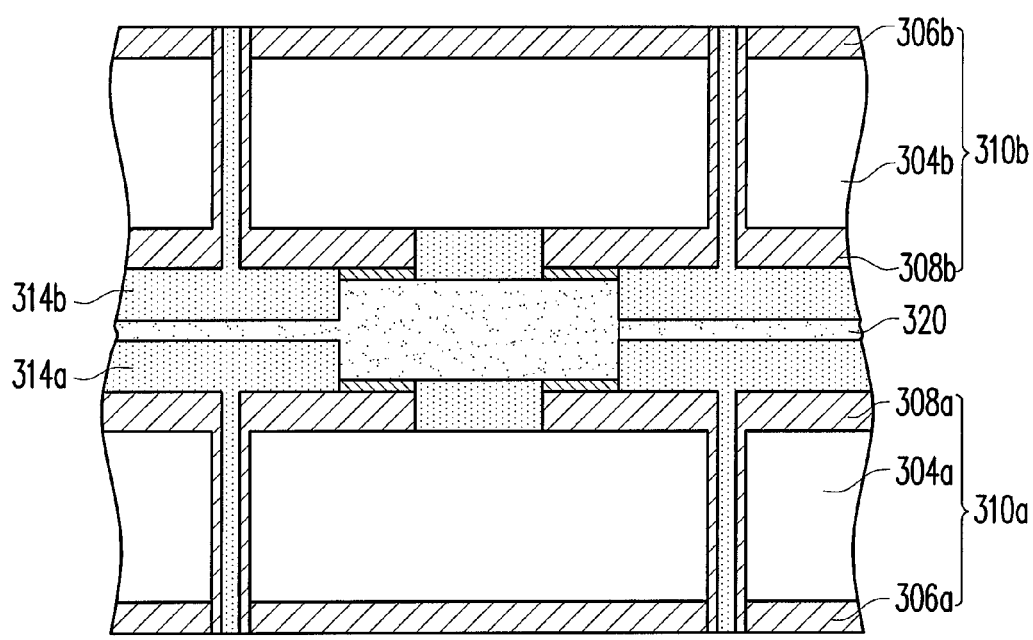

In Step 44 & FIG. 4G, the first and second laminate structures 310a, 310b are re-laminated together. As the first and second laminate structures 310a, 310b are laminated to a carrier film 320, the first and third metal layers 306a, 306b of the first and second laminate structures 310a, 310b become the external layers (i.e. face the outside). The carrier film 320 can be a peelable film, for example.

If the single-sided substrate structure is desired, the obtained first and second laminate structures 310a, 310b can be further processed to remove the first and third metal layers 306a, 306b. For single sided substrates, PTH plating may be optional.

If the double-sided substrate structure is desired, the first and third metal layers 306a, 306b of the obtained first and second laminate structures 310a, 310b can be further processed following the above described Steps 32-42.

Figure 5:
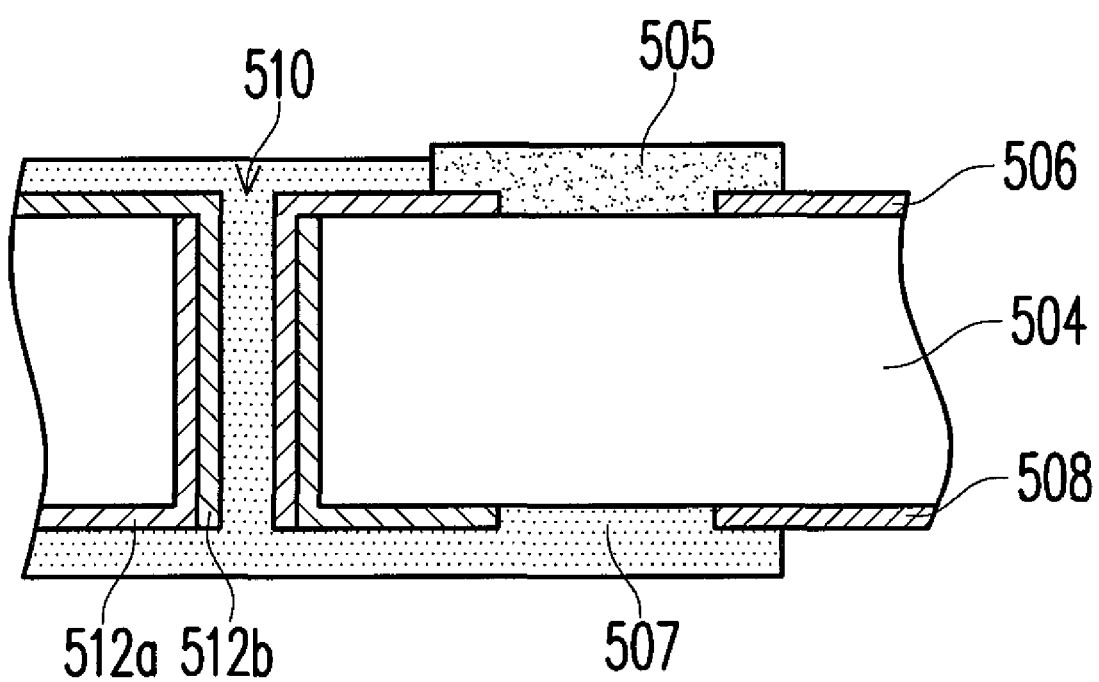
FIG. 5 shows a cross-sectional view of an example of the double-sided substrate structure of the present invention.

FIG. 5 shows a cross-sectional view of an example of the double-sided substrate structure of the present invention. The double-sided substrate structure 500 includes two patterned metal layers 506, 508 respectively disposed on both surfaces of the base 504 and mask layers 505, 507 over the patterned metal layers 506, 508.

If considering following the above steps to process both metal layers of the structure 500, it is optional to perform the drilling and plating process twice or just once. If the plated-through holes 510 are drilled twice and plated twice during processing, the resultant plated-through hole 510 has a first plating layer 512a covering the sidewall of the through hole and the surface surrounding the bottom opening of the through hole and a second plating layer 512b covering the first plating layer and the surface surrounding the top opening of the through hole. It can reinforce the corners of the plated-through holes and increase the total thickness of the plating layers. The material of the first and second plating layer can be copper or copper alloys, for example.

According to the fabrication process of the present invention, copper clad laminates can be stacked on both surfaces of the aluminum carrier, the release film, or the peelable mask film as the lamination structure, and the lamination structure can be processed and separated to provide pseudo single-sided substrates. In addition, the pseudo single-sided substrates can be re-laminated and processed (the other side) to provide single-sided or double-sided substrates.

To sum up, the fabrication process of the present invention can efficiently provide single-sided substrates or double-sided substrates based on the currently standard two-layer manufacturing technology. Furthermore, the productivity can be practically doubled without wasting the processing materials or the production line.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a multi-layered substrate, comprising:
    providing a double-sided lamination structure having at least a core structure, first and second passivation layers over both surfaces of the core structure, and first and second metal layers respectively on the first and second passivation layers;
    forming a plurality of plated-through holes in the double-sided lamination structure;
    patterning the first and second metal layers;
    forming first and second mask layers respectively over the patterned first and second metal layers; and
    performing a separating process to detach the patterned first and second metal layers and the first and second passivation layers from the core structure respectively.

2. The method of claim 1, further comprising performing a punching/routing process before the separating process to remove a portion of the double-sided lamination structure.

3. The method of claim 1, after forming the first and second mask layers, further comprising performing a surface plating process to form a nickel/gold layer on the patterned first and second metal layers which are exposed by the first and second mask layers.

4. The method of claim 1, wherein the first and second metal layers are made of copper.

5. The method of claim 1, wherein the core structure is made from a release film or a peelable mask film, and the separating process comprises peeling the patterned first metal layer and the first passivation layer or the patterned second metal layer and the second passivation layer apart from the core structure.

6. The method of claim 1, wherein the double-sided lamination structure further comprises a third metal layer disposed between the first passivation layer and the core structure and a fourth metal layer disposed between the second passivation layer and the core structure, and the third and fourth metal layers are separated from the core structure by the separating process, so as to obtain a first laminate structure comprising the patterned first metal layer, the third metal layer and the first passivation layer in-between and a second laminate structure comprising the patterned second metal layer, the fourth metal layer and the second passivation layer in-between.

7. The method of claim 6, wherein the third and fourth metal layers are made of copper.

8. The method of claim 6, wherein the core structure is made from a release film, a peelable mask film or an aluminum layer, and the first laminate structure or the second laminate structure is peeled apart from the core structure.

9. The method of claim 6, further comprising re-laminating the first and second laminate structures to both surfaces of a peelable carrier, so that the third and fourth metal layers become the outermost layers.

10. The method of claim 9, further comprising removing the third and fourth metal layers after the step of re-laminating the first and second laminate structures.

11. The method of claim 9, further comprising patterning the third and fourth metal layers after the step of re-laminating the first and second laminate structures.

12. The method of claim 11, further comprising forming third and fourth mask layers respectively over the patterned third and fourth metal layers.

13. The method of claim 9, further comprising re-drilling and re-plating the plated-through holes after the step of re-laminating the first and second laminate structures.

* * * * *